United States Patent [19]

Terada

[11] Patent Number: 5,324,540
[45] Date of Patent: Jun. 28, 1994

[54] SYSTEM AND METHOD FOR SUPPORTING AND ROTATING SUBSTRATES IN A PROCESS CHAMBER

[75] Inventor: Kazuo Terada, Tokyo, Japan

[73] Assignees: Tokyo Electron Limited, Tokyo; Tokyo Electron Tohoku Limited, Esashi, both of Japan

[21] Appl. No.: 107,002

[22] Filed: Aug. 17, 1993

[30] Foreign Application Priority Data

Aug. 17, 1992 [JP] Japan .................... 4-239996
Jun. 19, 1993 [JP] Japan .................... 5-172267

[51] Int. Cl.$^5$ ............................ C23C 16/00
[52] U.S. Cl. ................... 427/255.5; 427/248.1; 118/500; 118/730; 118/733
[58] Field of Search ......... 118/730, 500, 733; 427/248.1, 255.5

[56] References Cited

U.S. PATENT DOCUMENTS 5,016,567  5/1991  Iwabuchi .................... 118/730
5,058,526 10/1991  Matsushita ................. 118/715

Primary Examiner—Richard Bueker
Attorney, Agent, or Firm—Oblon, Spivak, McClelland, Maier & Neustadt

[57] ABSTRACT

A system for supporting and rotating substrates in a process chamber comprising a first exhaust vacuum pump for exhausting the process chamber, a shaft vertically extending into the process chamber to support wafers in it, bearings for supporting the shaft rotatable, a mechanism for rotating the shaft together with the wafers, a bearing casing for covering the bearings and communicated with the process chamber, a second exhaust vacuum pump for exhausting the bearing casing, and a controller for controlling the first and second exhaust vacuum pumps in such a way that the bearing casing is exhausted by the second exhaust vacuum pump before the process chamber is exhausted by the first exhaust vacuum pump.

11 Claims, 4 Drawing Sheets

SYSTEM AND METHOD FOR SUPPORTING AND ROTATING SUBSTRATES IN A PROCESS CHAMBER

BACKGROUND OF THE INVENTION

1. Field of the Invention

The present invention relates to a system having a process chamber such as the heat process and load lock chambers of the vertical type and serving to support and rotate substrates such as semiconductor wafers, which are to be processed, in the process chamber. The present invention also relates to a method of supporting and rotating the substrates in the process chamber.

2. Description of the Related Art

When the heat-diffusing, heat-oxidizing or CVD film forming process is to be applied to the semiconductor wafers, the heat process apparatus of the vertical type is usually used. In the case of the heat process apparatus of the vertical type, a wafer boat is rotated round a vertical shaft in a process tube so as to enable a certain processing rate to be achieved. A boat supporting and rotating system has a double-magnet structure in which an outer (or drive) magnet and an inner (or driven) magnet are combined with each other to seal the process chamber from outside. When the outer magnet is rotated in this case, the inner one is also rotated following the outer magnet. In short, the boat supporting and rotating system is intended to use the magnetic interaction of the outer and inner magnets to transmit rotation force to the wafer boat. The wafer boat is rotated together with the inner magnet in this case.

Rare earth magnets are used as these inner and outer ones. They have a strong coercive force and an excellent heat resistance, but they are fragile and easily broken. They are therefore nickel-plated to prevent particles from being caused from them. When impact is added to them, however, the layer of nickel-plate is peeled off from them and metal contamination is caused accordingly. When magnetic material is thus exposed, it is eroded by erosive process gas and the amount of particles thus caused is increased accordingly.

In order to prevent oil contamination, the boat supporting and rotating system uses ceramics bearings which make it unnecessary to use lubricating oil in the bearing casing. However, each of these ceramics bearings is a combination of materials of different kinds. Particles are thus easily caused. When the process tube is exhausted after the wafer boat is carried into it, particles in the bearing casing of the boat supporting and rotating system are scattered into the process tube to thereby contaminate the wafers. In the case of the conventional boat supporting and rotating system, therefore, particles scattered into the process chamber cause metal contamination. This causes the productivity of the apparatus to become low.

SUMMARY OF THE INVENTION

The object of the present invention is therefore to provide a substrate supporting and rotating system capable of preventing particles and others caused from the system from entering into the process chamber not to contaminate substrates.

According to an aspect of the present invention, there can be provided a system for supporting and rotating substrates in a process chamber comprising first exhaust means for exhausting the process chamber; a shaft vertically extending into the process chamber to support the substrates in it; bearings for supporting the shaft rotatable; means for rotating the shaft together with the substrates; a bearing casing for covering the bearings and communicated with the process chamber; second exhaust means for exhausting the bearing casing; and control means for controlling the first and second exhaust means in such a way that the bearing casing is exhausted by the second exhaust means before the process chamber is exhausted by the first exhaust means.

A boat on which a plurality of wafers are mounted is carried into a process tube. A bearing casing of the boat supporting and rotating system is vacuum-exhausted before the process tube is vacuum-exhausted. Particles caused from bearings and a magnet stay in the bearing casing, but they are exhausted outside because the bearing casing is vacuum-exhausted at first. When the process tube is to be vacuum-exhausted, therefore, the scattering of particles from the bearing casing can be reduced to thereby prevent the substrates or wafers from being contaminated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Some systems for supporting and rotating substrates according to the present invention will be described with reference to the accompanying drawings.

Figure 1:
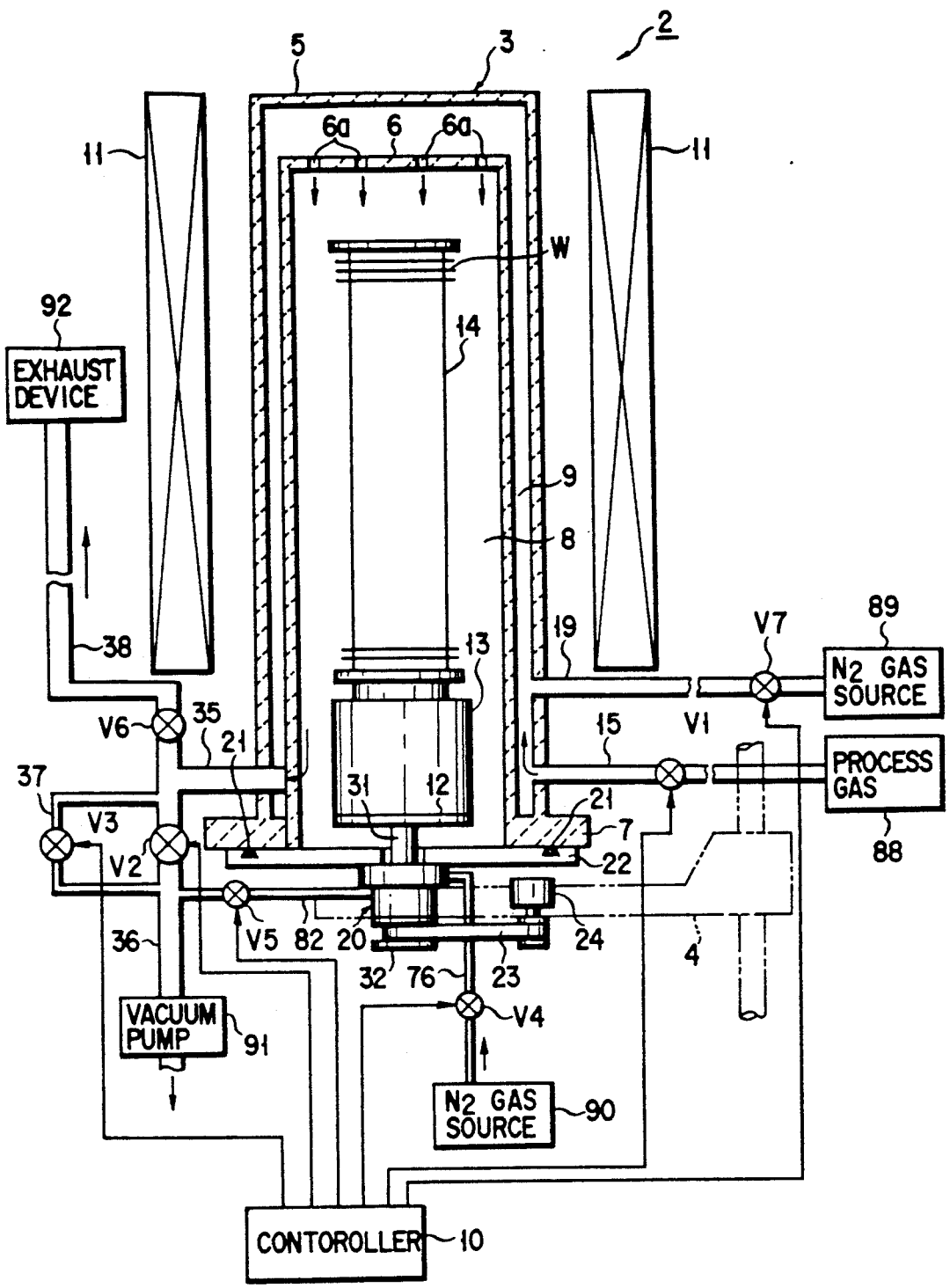
FIG. 1 is a mechanism block diagram showing a heat process apparatus of the vertical type partly cut away.

As shown in FIG. 1, a heat process apparatus 2 of the vertical type has a process tube 3 made of quartz and comprising two inner and outer cylinders 5 and 6. A heater 11 is arranged around the outer cylinder 5 to heat a wafer boat 14 in the process tube 3 to a temperature higher than 1000° C. Fifty sheets of silicon wafers W are mounted on the boat 14 of the vertical type. Two gas supply pipes 15 and 19 are passed through the lower portion of the outer cylinder 5 and communicated with a clearance 9 between the inner 5 and the outer cylinder 6. The gas supply pipe 15 is communicated, at the other end thereof, with a process gas supply source 88 through a main valve V1. The process gas supply source 88 includes HCl gas cylinder and oxygen gas cylinder each having a flow rate adjuster. The gas supply pipe 19 is communicated, at the other end thereof, with a nitrogen gas supply source 89 through a valve V7.

A plurality of gas introducing holes 6a are formed in the top of the inner cylinder 6 so that gas introduced can flow downwards in a process region 8 (or a space in the inner cylinder 6), passing through the clearance 9 and the gas introducing holes 6a. The bottom of the process tube 3 is made open. While wafers W on the boat 14 are being processed, this open bottom of the process tube 3 is air-tightly closed by a cap member 22. An annular groove is formed in the top of the cap member 22 and an O-ring 21 is held in the annular groove. When the open bottom of the tube 3 is closed by the cap member 22, the O-ring 21 in the top of the can member 22 is pushed against a flange 7 of the tube 3 to keep the inside of the process tube 3 air-tight.

An exhaust pipe 35 passes through the lower portions of the outer and inner cylinders 5 and 6 to exhaust the process region 8 in the inner cylinder 6. It is branched into first and second exhaust pipes 36 and 38. The first exhaust pipe 36 is communicated with a vacuum pump 91 through a valve V2. The second exhaust pipe 38 is communicated with an exhaust device 92 through a valve V6. The exhaust device 92 is one of factory exhaust systems (not shown) provided with blowers having a large capacity.

A bypass pipe 37 is communicated with the first exhaust pipe 36 up- and down-stream the valve V2. A valve V3 is attached to the bypass pipe 37. A third exhaust pipe 82 is communicated with the first exhaust pipe 36 downstream the valve V2. The third exhaust pipe 82 is communicated, at the other end thereof, with a bearing casing 46 of a boat supporting and rotating system 20. It includes a valve V5 on the way of it. A gas supply pipe 76 is also communicated with the bearing casing 46. It is communicated, at its other end, with a nitrogen gas supply source 90 through a valve V4.

The boat supporting and rotating system 20 is attached to the underside of the cap member 22 at the center portion thereof. The boat supporting and rotating system 20 and the cap member 22 are supported, movable up and down, by an elevator 4.

It will be described how the boat supporting and rotating system 20 is driven. A pulley 32 is attached to the lower end of a vertical shaft 31 and a belt 23 is stretched between the pulley 32 and the drive shaft of a motor 24. A rotating table 12 is attached to the upper end of the vertical shaft 31. An insulator sleeve 13 is mounted on the rotating table 12 and the wafer boat 14 is mounted on the top of the insulator sleeve 13.

The operation of the heat process apparatus of the vertical type is controlled by a controller 10. Switch drive sections of the valves V1–V7 are connected to the output side of the controller 10. The heater 11, motor 24, gas supply sources 88, 89, 90, vacuum pump 91 and exhaust device 92 are also connected to the output side of the controller 10.

Figure 2:
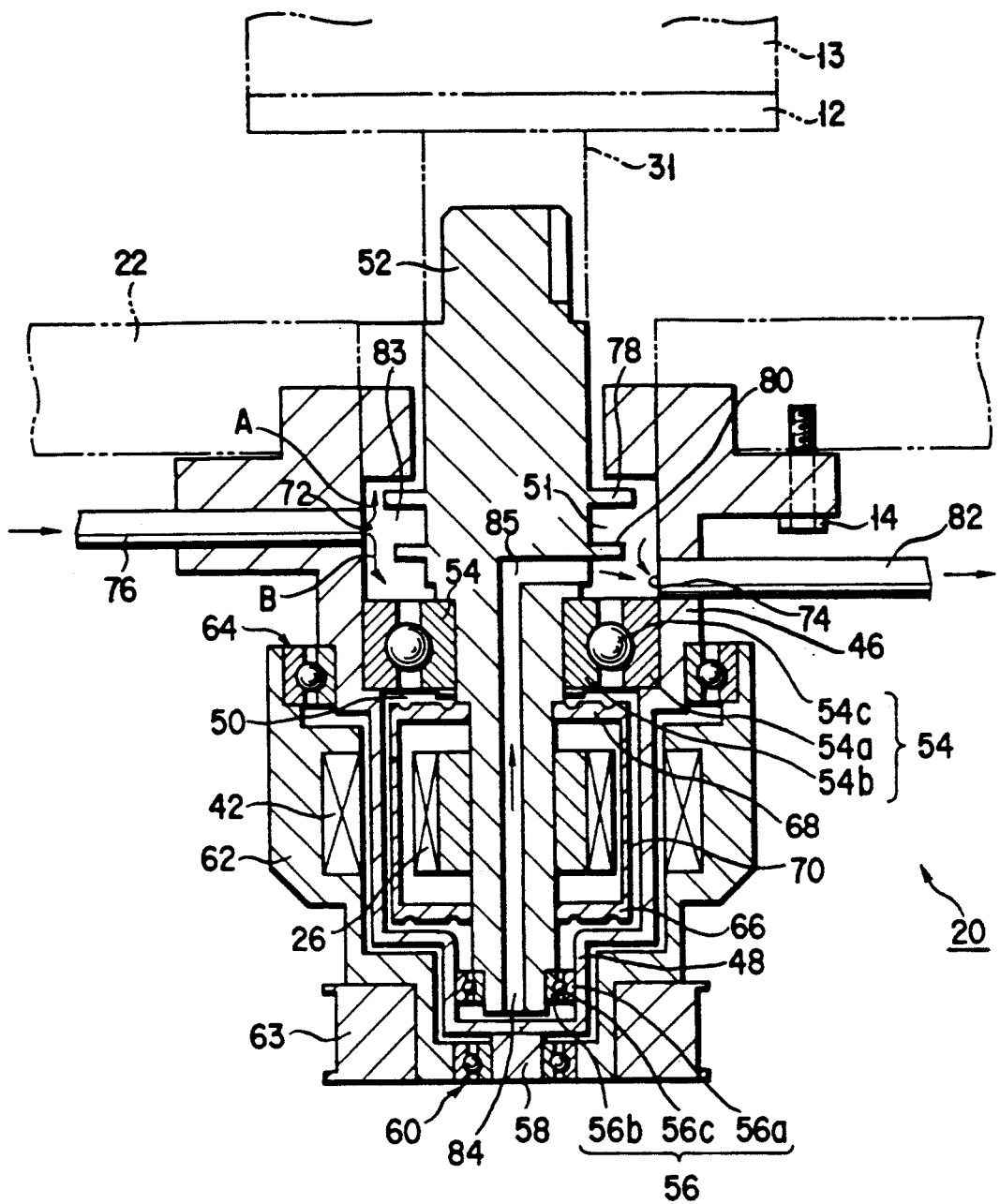
FIG. 2 is a vertically-sectioned view showing a rotating system of the heat process apparatus of the vertical type according to the present invention.

The boat supporting and rotating system 20 will be described in detail referring to FIG. 2.

The boat supporting and rotating system 20 is covered by a fixed casing 46 and a rotating casing 62 made of stainless steel. A pair of bearings 60 and 64 are arranged between both casings 46 and 62 to enable the rotating casing 62 to be rotated relative to the fixed casing 46. The fixed casing 46 is fixed to the cap member 22 by plural bolts 14. A pulley 63 is attached to the lower end of the rotating casing 62. A drive permanent magnet 42 is attached to the middle portion of the rotating casing 62.

The middle portion of a rotating shaft 52 is rotatably supported through a large-sized ceramics bearing 54 by the fixed casing 46 and the lower end portion thereof through a small-sized ceramics bearing 56 by the fixed casing 46. The large-sized bearing 54 is intended to receive all of load added by the wafers W, the boat 14 and the others. It is preferable that two of the ceramics bearings 54 and 56 are separated as remote as possible from each other.

These bearings 54 and 56 include outer and inner wheels 54a, 56a and 54b, 56b made of stainless steel and bearing balls 54c and 56c made of ceramics such as $Si_3N_4$. The rotating shaft 52 is able to detach from the vertical shaft 31.

A space 50 is formed between the rotating shaft 52 and the fixed casing 46. It is communicated with the nitrogen gas supply source 90 through a gas inlet 72 and the gas supply pipe 76. It is also communicated with the vacuum pump 91 and the exhaust device 92 through a gas outlet 74 and an exhaust pipe 82.

Plural ring-shaped projections 78 and 89 are projected from the middle portion of the rotating shaft 52 to form a labyrinth seal 83 just above the bearing 54. A passage is formed in the lower portion of the rotating shaft 52 and its bottom opening 84 is located adjacent to the lower ceramics bearing 56 while its top opening 85 adjacent to the upper ceramics bearing 54.

A driven permanent magnet 26 is attached to the lower portion of the rotating shaft 52 (or to the rotating shaft 52 between the bearings 54 and 56). It is opposed to the drive permanent magnet 42 attached to the rotating casing 62. It is divided into twelve poles in the circumferential direction of the shaft 52. The drive permanent magnet 42 is also divided into twelve poles in the same way.

The driven permanent magnet 26 is fully covered by a covering member 66, which comprises a pair of ring plates 68 made of stainless steel and attached to the rotating shaft 52, and a stainless steel foil 70 arranged between the upper and the lower ring plate 68 and welded to the outer rims of them. The material of which the covering member 66 is made is not limited only to stainless steel. It may be made of other metal or non metal materials having excellent heat and erosion resistances.

The stainless steel-made pipe 76 connected to the gas inlet 72 has a diameter of about 6 mm. Nitrogen gas is supplied into the space 50 through this pipe 76 at a flow rate of 5 liters per minute. The labyrinth seal 83 is designed in such a way that gas which flows into the space 50 through the gas inlet 72 and then advances downward (or in a direction B) has a flow rate larger than that at which it advances upward (or in a direction A).

The gas outlet 74 is positioned remotest from the gas inlet 72 (or at an opposite side separated from the gas inlet 72 round the rotating shaft 52 by 180°). It is also positioned just a little under the lower labyrinth ring 80. A water cooling mechanism may be incorporated into the boat supporting and rotating system 20.

Figure 3:
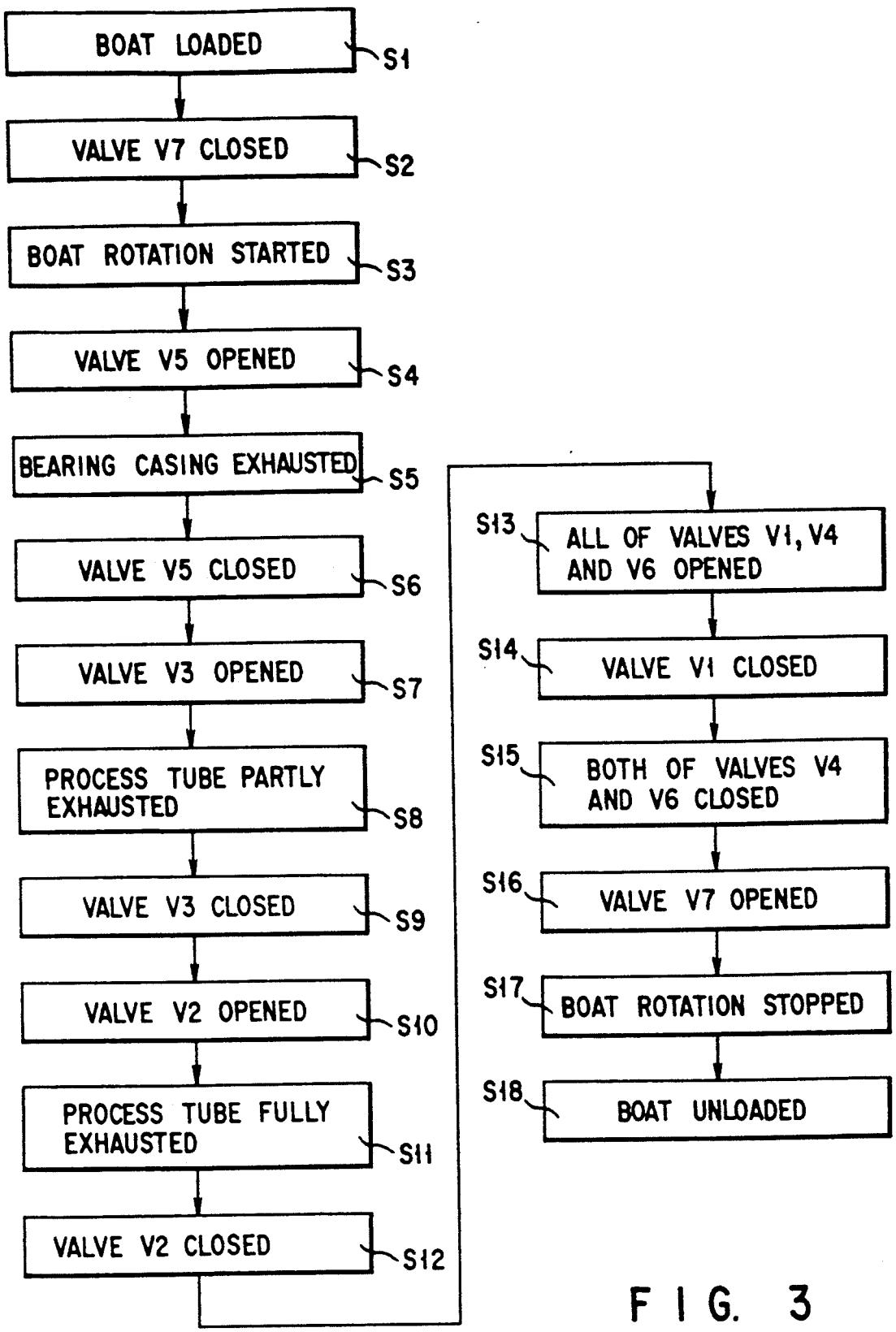
FIG. 3 is a flow chart showing how wafers are oxidized and heat-processed in the heat process apparatus of the vertical type.

Referring to FIG. 3, it will be described how silicon wafers W are oxidized and diffused by the above-described heat process apparatus 2 of the vertical tape.

Fifty sheets of silicon wafers W are transferred into the boat 14, which is then mounted together with the insulator sleeve 13 on the rotating table 12. The boat 14 is lifted into the process tube 3 by the boat elevator 4 (Step S1). The cap member 22 is thus pushed against the bottom flange 7 of the process tube 3 to air-tightly close the open bottom of the tube 3.

The inside of the process tube 3 is previously heated to a temperature of about 400°-600° C. before the boat 14 is carried into the process tube 3. After the boat 14 is carried into it, its inside is further heated to a range of process temperature, e.g. 900°-1200° C. Nitrogen gas is also previously supplied from the gas supply source 89 into it. After the boat 14 is loaded into it, the valve V7 is closed and the supply of nitrogen gas into it is stopped according a predetermined program by the controller 10 (Step S2).

The wafer boat 14 is slowly rotated at a speed of 3-5 rpm by the system 20 (Step S3). The drive magnet casing 62 rotates this time round the bearing and magnet casings 46 and 48. When it rotates in this manner, the driven permanent magnet 26 is rotated following it. As the result, the wafer boat 14 is rotated together with the rotating shaft 52.

The ceramics bearings 54, 56 and the driven permanent magnet 26 are housed in the bearing casing 46. The space 50 in the bearing casing 46 is communicated with the process region 8 in the tube 3 through the labyrinth seal 83. Nitrogen gas is introduced into the space 50 through the gas introducing pipe 76 at a flow rate of 0.5 liters/min.

The valve V5 is opened (Step S4) and the space 50 is exhausted only for about ten seconds through the exhaust pipe 82 by the vacuum pump 91 (Step S5). The valve V5 is then closed (Step S6) and the sub-valve V3 is opened (Step S7). The process tube 3 is partly exhausted only for 30 seconds (slow exhaust) under this state (Step S8). The process tube 3 comes to have an internal pressure of about 5 Torr.

The sub-valve V3 is closed (Step S9) while the main valve V2 is opened (Step S10), and the process tube 3 is fully exhausted under this state (Step S11). When the internal pressure in the process tube 3 reaches about $1 \times 10^{-3}$ Torr, the valve V2 is closed (Step S12) and all of the valves V1, V4 and V6 are opened (Step S13). Process gas is introduced from the process gas supply source 88 into the process tube 3 at a predetermined flow rate to apply oxidization- or heat-diffusion-process to the silicon wafers W. HCl gas or oxygen gas is used as process gas. At the same time process gas is introduced into the process tube 3, nitrogen gas is supplied from the nitrogen gas supply source 90 into the bearing casing 46 of the system 20 at a flow rate of 0.5 liters per minute (nitrogen gas purge). The exhausting capacity of the exhaust device 92 is controlled to make the internal pressure in the process tube 3 same as atmospheric pressure. This can prevent process gas from entering from the process region 8 into the space 50 to thereby prevent bearings 54 and 56 from being eroded.

When the rotating shaft 31 is rotated, particles are caused from the bearings 54 and 56. A part of the particles is exhausted together with purge ga outside the bearing casing 46, but most of them adhere to the ceramics bearings 54, 56 and remain in corners of the casing. If the space 50 is firstly exhausted after the wafers W are loaded into the process tube 3 (Step S5), therefore, particles adhered can be positively exhausted outside the casing 46. Particles can be thus prevented from floating from the space 50 into the process region 8 in the process tube 3 when the bearing casing 46 is purged by nitrogen gas (Step S13).

The main valve V1 is closed to stop the supply of process gas (Step S14). Both of the valves V4 and V6 are closed (Step S15) and the valve V7 is opened to supply nitrogen gas into the process tube 3 (Step S16). The rotation of the boat 14 is stopped (Step S17) and the boat 14 is carried out of the process tube 3 (Step S18).

Argon gas, neon gas and other gases may be used as purge gas supplied into the space 50.

Although the vacuum pump 91 has been provided independently of the exhaust device 92, an exhaust device may be used commonly to exhaust both of the space 50 and the process region 8.

Although the heat process apparatus of the vertical type has been used as oxidization- and diffusion-process one in the above-described case, it may be used as CVD, etching and ashing ones.

Particles caused are exhausted together with nitrogen gas through the exhaust pipe 82 not to enter into the process region 8 in the process tube 3. Even if the covering member 66 should be broken to thereby cause particles of the magnet 26 to be leaked into the space 50, they can be also exhausted through the exhaust pipe 82 not to enter into the process region 8.

Particularly, the labyrinth seal 83 is provided adjacent to the gas inlet 72 and the pressure of atmosphere in this area 83, therefore, becomes a little higher. Gas is thus forced to flow from the area 83 in the up- and down-ward directions A and B. In addition, the gas outlet 74 is located just under the lower labyrinth ring 80. Therefore, particles caused from the ceramics bearings 54 and 56 can be guided to the gas outlet 74 by gas flowing in the downward direction B.

Further, the diameter of the lower labyrinth ring 80 is made smaller than that of the upper labyrinth ring 78 and the amount of gas flowing in the downward direction B thus becomes larger. As the result, particles can be surely prevented from flowing in the upward direction A.

Gas flowing in the upward direction A can prevent erosive gas (or process gas) from entering from the process region 8 into the space 50. Metal components and the magnet 26 in the space 50 can be thus prevented from being eroded.

Kinds and flow rates of gases introduced are selected not to add any influence to process conditions under which the wafers are heat-processed.

Gas including particles therein is likely to stay in the lower portion of the space 50, but this staying gas can be exhausted outside through the connected passages 84, 85 in the rotating shaft 52 and through the exhaust pipe 82.

Each of the bearings for the rotating shaft 52 and the drive magnet casing 62 is designed to have such a dimension that allows it to accurately embrace its bearing balls at a temperature of 200° C. when the wafers are to be heat-processed. In a case where the bearings are rotated under normal temperature when the wafers are to be transferred, therefore, the bearings themselves enjoy a little play and this may cause the rotating shaft 52 and the drive magnet casing 62 to be a little played. However, the rotating shaft 52 and the drive magnet casing 62 are supported by the two ceramics bearings 54, 56 and the normal pulley bearings 60, 64 while providing larger spans between the bearings 54 and 56 and between the bearings 60 and 64, as compared with those in the conventional apparatuses. The playing of the rotating shaft 52 and the drive magnet casing 62 can be thus reduced to a greater extent.

Figure 4:
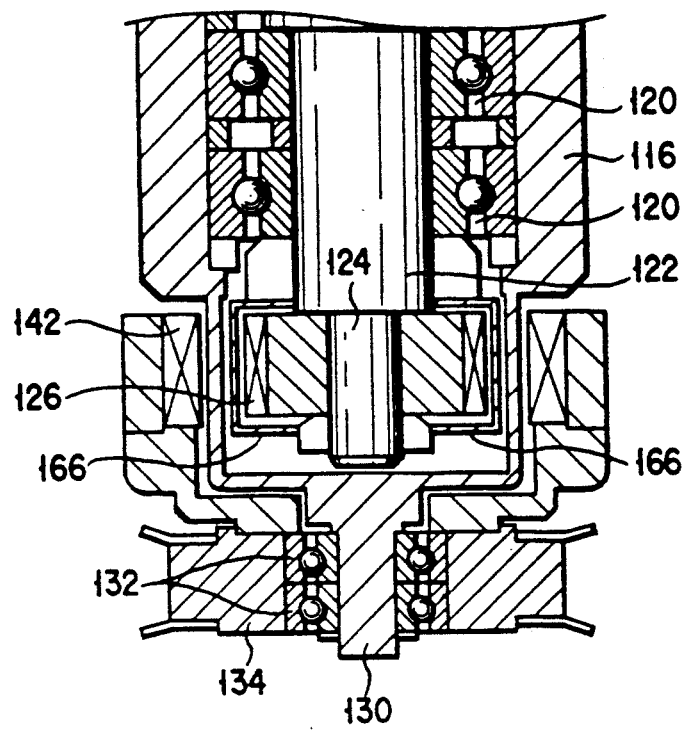
FIG. 4 is a vertically-sectioned view showing another rotating system according to the present invention.

As shown in FIG. 4, both of intervals between paired bearings 120 and between paired bearings 132 may be made smaller. The paired bearings 120 support a shaft 122 rotatable in relation to a casing 116. The paired bearings 132 support a pulley 134 rotatable in relation to the casing 116. A driven permanent magnet 126 is attached to a lower portion 124 of the rotating shaft 122 and covered by a covering member 166.

Figure 5:
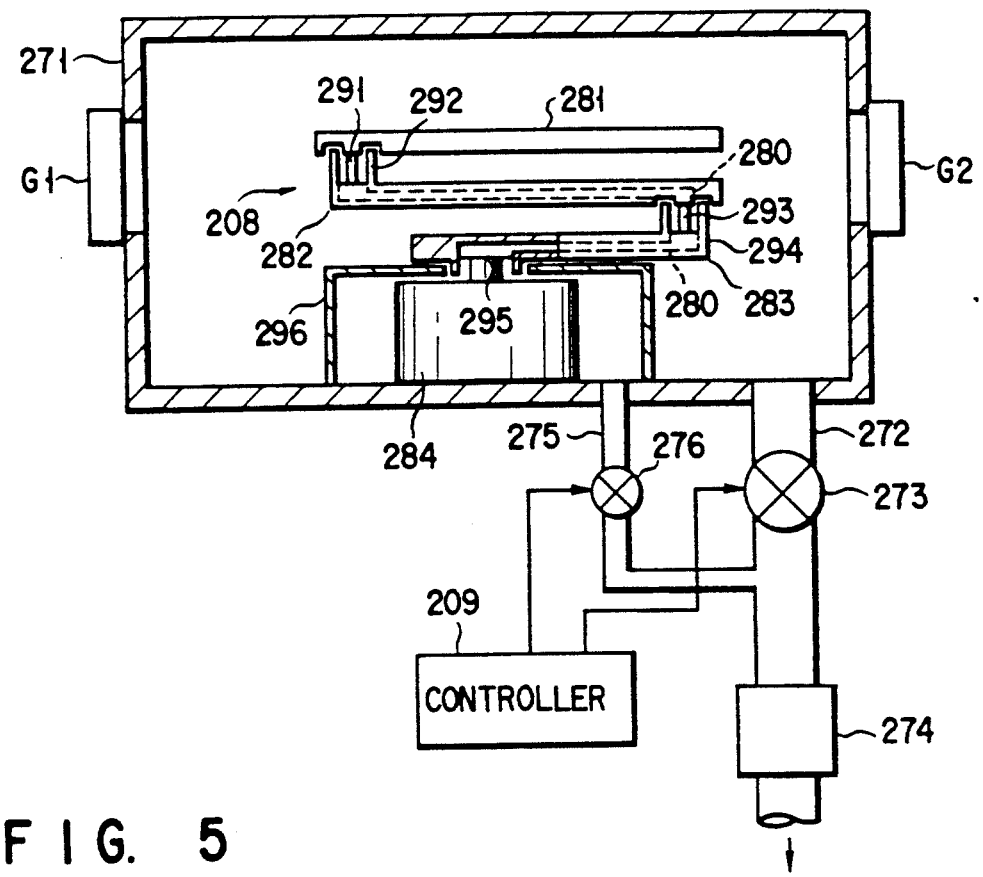
FIG. 5 is a vertically-sectioned view showing the rotating system arranged in the load lock chamber.

The wafer supporting and rotating system according to another embodiment of the present invention will be described referring to FIG. 5. The system is arranged in a load lock chamber in this case.

The load lock chamber 271 serves as an auxiliary one for depressurized chambers (not shown) in which etching, CVD and ion injecting processes are carried out. The load lock chamber 271 includes gate valves G1, G2 and a wafer carrier unit 208. An exhaust pipe 272 is connected to the load lock chamber 271 at one end thereof and to a vacuum pump 274 through a valve 273 at the other end thereof.

The carrier unit 208 has three-joint link arms 281, 282 and 283, which are stretched and shrunk by a belt drive mechanism. Drive transmitting sections 291, 293 and 295 each including a belt and pulleys are covered by covering members 292, 294 and 296. A drive source 284 in which a motor is housed is also covered by the covering member 296. The covering members 292, 294 and 296 are communicated with one another through passage 280.

An exhaust pipe 275 is communicated with the covering member 296 and also with the vacuum pump 274 through a valve 276. Each of the valves 273 and 276 is controlled as follows by a control section 209.

After the wafers are carried in and before the valve 273 is opened, the valve 276 is opened to exhaust the passage 280. The valve 273 is then opened to exhaust the load lock chamber 271. Particles caused in the drive transmitting sections 291, 293 and 295 can be thus prevented from scattering into the process chambers (not shown).

According to the above-described embodiments of the present invention, the drive permanent magnet is covered by the covering member. Particles caused from the magnet can be thus confined in the covering member not to enter into the process region in the process tube. This can prevent metal components from being contaminated.

Further, inactive gas is introduced into the bearing casing and particles in the bearing casing are exhausted outside together with the gas introduced. The particles can be thus prevented from the bearing casing into the chamber (or process region). This can also prevent metal components from being contaminated.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the genera inventive concept as defined by the appended claims and their equivalents.

What is claimed is:

1. A system for supporting and rotating substrates in a process chamber comprising:

first exhaust means for exhausting the process chamber;

a shaft vertically extending into the process chamber to support the substrates in it;

bearings for supporting the shaft rotatable;

means for rotating the shaft together with the substrates;

a bearing casing for covering the bearings and communicated with the process chamber;

second exhaust means for exhausting the bearing casing; and control means for controlling the first and second exhaust means in such a way that the bearing casing is exhausted by the second exhaust means before the process chamber is exhausted by the first exhaust means.

2. The system according to claim 1, further comprising a driven permanent magnet attached to the shaft in the bearing casing and a drive permanent magnet arranged outside the bearing casing to have magnetic interaction with the driven permanent magnet to add rotation force to the shaft.

3. The system according to claim 2, further comprising a covering member for air-tightly covering the driven permanent magnet in the bearing casing.

4. The system according to claim 2, wherein the bearings are two and these two bearings are separated from each other in such a way providing the drive permanent magnet between two bearings.

5. The system according to claim 1, further comprising ring members located in a passage through which the process chamber and the bearing casing are communicated with each other, and attached to the shaft to form a labyrinth seal.

6. The system according to claim 1, further comprising means for introducing protection gas into the bearing casing.

7. The system according to claim 6, wherein said protection gas is nitrogen gas.

8. The system according to claim 1, wherein said process chamber is a process tube of the heat process apparatus of the vertical type.

9. The system according to claim 1, wherein said process chamber is a process tube of the CVD apparatus of the vertical type.

10. The system according to claim 1, wherein said process chamber is a load lock one.

11. A method of supporting and rotating substrates in a process chamber comprising:

preparing a heat process apparatus of the vertical type provided with a process tube, heater means and first exhaust means, and wafer boat supporting and rotating means provided with second exhaust means;

supporting a wafer boat in the process tube by the wafer boat supporting and rotating means;

heating the wafer boat in the process tube., exhausting a bearing casing for the wafer boat supporting and rotating means by the second exhaust means;

partly exhausting the process tube by the first exhaust means;

fully exhausting the process tube by the first exhaust means;

supplying process gas into the process tube while rotating the wafer boat to form heat-processed film on the surface of each wafer., exhausting the process tube by the first exhaust means; and carrying the wafer boat out of the process tube.

* * * * *